United States Patent
Kim

(10) Patent No.: US 10,520,961 B2
(45) Date of Patent: Dec. 31, 2019

(54) REFERENCE VOLTAGE GENERATOR

(71) Applicant: SK hynix Inc., Icheon-si (KR)

(72) Inventor: Tae-Gyu Kim, Namyangju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/177,209

(22) Filed: Oct. 31, 2018

(65) Prior Publication Data

US 2019/0187734 A1    Jun. 20, 2019

(30) Foreign Application Priority Data

Dec. 15, 2017  (KR) .......................... 10-2017-0173035

(51) Int. Cl.
G05F 1/575 (2006.01)
G05F 1/46 (2006.01)
G05F 3/30 (2006.01)
H03F 1/30 (2006.01)
H03F 3/45 (2006.01)

(52) U.S. Cl.
CPC .............. *G05F 1/468* (2013.01); *G05F 1/461* (2013.01); *G05F 1/575* (2013.01); *G05F 3/30* (2013.01); *H03F 1/30* (2013.01); *H03F 3/45475* (2013.01); *H03F 3/45071* (2013.01); *H03F 2203/45526* (2013.01); *H03F 2203/45534* (2013.01)

(58) Field of Classification Search
None
See application file for complete search history.

(56) References Cited

U.S. PATENT DOCUMENTS 8,330,536 B1 * 12/2012 Quinn ................. H03F 3/45475
330/109
9,319,033 B1 * 4/2016 Jin ......................... H03K 4/502
(Continued)

FOREIGN PATENT DOCUMENTS

KR    10-2001-0076727    8/2001
KR    10-0709353    4/2007

OTHER PUBLICATIONS

Ceekala, Vijaya G. et al., A Method for Reducing the Effects of Random Mismatches in CMOS Bandgap References, IEEE International Solid-State Circuits Conference, 2002, 23.7.
(Continued)

*Primary Examiner* — Jeffrey A Gblende
(74) *Attorney, Agent, or Firm* — Perkins Coie LLP

(57) ABSTRACT

A reference voltage generator may include: a differential amplification circuit including a positive input terminal coupled to a supply voltage to receive a voltage from the supply voltage and a negative input terminal coupled to an output terminal of the differential amplification circuit, the differential amplification circuit structured to perform a reset operation based on the received voltage from the supply voltage during a reset period and amplify a difference between a first initial voltage applied to the positive input terminal and a second initial voltage applied to the negative input terminal during a reference voltage generation period; and first and second voltage storage circuits coupled to the positive input terminal and the negative input terminal, respectively, and structured to store the first initial voltage and the second initial voltage, respectively.

22 Claims, 5 Drawing Sheets

(56) References Cited

U.S. PATENT DOCUMENTS

| | | | |
|---|---|---|---|
| 2010/0321103 A1* | 12/2010 | David | G05F 3/08 |
| | | | 327/551 |
| 2012/0161994 A1* | 6/2012 | Quiquempoix | H03F 3/005 |
| | | | 341/143 |
| 2015/0263714 A1* | 9/2015 | Yoo | H03K 5/1252 |
| | | | 327/133 |
| 2017/0257113 A1* | 9/2017 | Singh | G05F 3/245 |

OTHER PUBLICATIONS

Ge, Guang et al., A Single-Trim CMOS Bandgap Reference with a $3\sigma$ Inaccuracy of $\pm 0.15\%$ from $-40°$ C. to $125°$ C., IEEE International Solid-State Circuits Conference, 2010, 4.3, pp. 78-80.

Souri, Kamran et al., A CMOS Temperature Sensor with a Voltage-Calibrated Inaccuracy of $\pm 0.15°$ C. ($3\sigma$) From $-55$ to $125°$ C., IEEE International Solid-State Circuits Conference, 2012, 11.7, pp. 208-210.

Maderbacher, Gerhard et al., A Digitally Assisted Single-Point-Calibration CMOS Bandgap Voltage Reference with a $3\sigma$ Inaccuracy of $\pm 0.08\%$ for Fuel-Gauge Applications, IEEE International Solid-State Circuits Conference, 2015, 5.8, pp. 102-104.

Gruber, Dominik et al., A Voltage Reference with On-Chip Trimmable Temperature Coefficient and Offset Voltage, Mixed Design 18th International Conference, 2011, pp. 231-236.

\* cited by examiner

REFERENCE VOLTAGE GENERATOR

CROSS-REFERENCE TO RELATED APPLICATION

This patent document claims priority under 35 U.S.C. § 119 to Korean Patent Application No. 10-2017-0173035 filed on Dec. 15, 2017, which is incorporated herein by reference in its entirety.

TECHNICAL FIELD

Exemplary embodiments of the disclosed technology relate to a reference voltage generator.

BACKGROUND

In general, during a fabrication of an integrated circuit, process variations occur from various reasons. The process various negatively affect a circuit performance and thus, many efforts have been made to reduce the process variations and make the circuit accurately operate as originally designed.

SUMMARY

The disclosed technology in this patent document includes circuits or devices and their applications in electronic devices or system which provide a reference voltage generator. Various embodiments of the disclosed technology are directed to a reference voltage generator capable of improving or maximizing the precision of a reference voltage by minimizing an influence of process variation.

In an embodiment, a reference voltage generator may comprise a differential amplification circuit including a positive input terminal coupled to a supply voltage to receive a voltage from the supply voltage and a negative input terminal coupled to an output terminal of the differential amplification circuit, the differential amplification circuit structured to perform a reset operation based on the received voltage from the supply voltage during a reset period and amplify a difference between a first initial voltage applied to the positive input terminal and a second initial voltage applied to the negative input terminal during a reference voltage generation period; and first and second voltage storage circuits coupled to the positive input terminal and the negative input terminal, respectively, and structured to store the first initial voltage and the second initial voltage, respectively.

The reference voltage generator may further include an output circuit coupled to the differential amplification circuit and structured to stabilize an output voltage outputted from the differential amplification circuit. The output circuit may include a switch turned on in a reference voltage stabilization period to couple the output terminal of the differential amplification circuit and an output node of the output circuit; and a capacitor coupled between the output node and a ground voltage. The reference voltage generator may further include an input circuit coupled to the supply voltage and coupled to the positive input terminal of the differential amplification circuit during the reset period to applying the voltage from the supply voltage to the differential amplification circuit. The input circuit may include a first resistor having one terminal coupled to the supply voltage; a first switch turned on in the reset period, and coupled between the other terminal of the first resistor and the positive input terminal of the differential amplification circuit; a second resistor having one terminal coupled to the other terminal of the first resistor; and a second switch coupled between the other terminal of the second resistor and a ground voltage. During the reset period, the first voltage storage circuit may store the first initial voltage according to the reset operation of the differential amplification circuit, and provides the stored first initial voltage to the positive input terminal of the differential amplification circuit, and the second voltage storage circuit stores the second initial voltage according to the reset operation of the differential amplification circuit, and provides the stored second initial voltage to the negative input terminal of the differential amplification circuit. During the reference voltage generation period, the differential amplification circuit may further output an output voltage applied to the output terminal of the differential amplification circuit as a reference voltage. The differential amplification circuit may include a differential amplifier amplifying differences between the first initial voltage applied to the positive input terminal and the second initial voltage applied to the negative input terminal; a first switch turned on during the reset period to couple the output terminal of the differential amplification circuit to the negative input terminal of the differential amplification circuit; and a second switch turned on during the reference voltage generation period to couple the output terminal of the differential amplification circuit to the first and second voltage storage circuits. The first voltage storage circuit may store the first initial voltage in the reset period and provide the stored first initial voltage to the positive input terminal of the differential amplification circuit in the reference voltage generation period. The first voltage storage circuit may include a capacitor coupled between the positive input terminal of the differential amplification circuit and a first node located between the positive input terminal and a ground voltage; and a switch turned on in the reset period to couple the first node to the ground voltage. The first voltage storage circuit may include a resistor coupled between the output terminal of the differential amplification circuit and the first node; and a PNP transistor having an emitter terminal coupled to the first node and base and collector terminals that are coupled to the ground voltage. The first voltage storage circuit may include a resistor coupled between the output terminal of the differential amplification circuit and the first node; and a PMOS transistor having a source terminal coupled to the first node and gate and drain terminals that are coupled to the ground voltage. The second voltage storage circuit may store the second initial voltage in the reset period, and provides the stored second initial voltage to the negative input terminal of the differential amplification circuit in the reference voltage generation period. The second voltage storage circuit may include a capacitor coupled between the negative input terminal of the differential amplification circuit and a second node located between the negative input terminal and a ground voltage; and a switch turned on in the reset period to couple the second node to the ground voltage. The second voltage storage circuit may include a first resistor coupled between the output terminal of the differential amplification circuit and the second node; a second resistor coupled between the second node and an emitter terminal of a PNP transistor; and the PNP transistor having the emitter terminal coupled to the second resistor and base and collector terminals that are coupled to the ground voltage. The second voltage storage circuit may include a first resistor coupled between the output terminal of the differential amplification circuit and the second node; a second resistor coupled between the second node and a source terminal of a PMOS transistor; and the PMOS transistor having a source terminal coupled to the second node and gate and drain terminals that are coupled to the ground voltage. The differential amplifier offset may be caused by process mismatch. The reset period and the reference voltage generation period may repeat periodically.

In an embodiment, a reference voltage generator may comprise a differential amplifier structured to differentially amplify a difference between a voltage applied to a positive input terminal thereof and a voltage applied to a negative input terminal thereof, a first switch turned on in a reset period, and coupled between an output terminal of the differential amplifier and the negative input terminal of the differential amplifier; a second switch turned on in a reference voltage generation period, and having one terminal coupled to the output terminal of the differential amplifier; a first resistor coupled between the other terminal of the second switch and a first node; a first PNP transistor having an emitter terminal coupled to the first node and base and collector terminals coupled to a ground voltage; a first capacitor coupled between the positive input terminal of the differential amplifier and the first node, and suitable for storing a differential amplifier offset-containing initial voltage applied to the positive input terminal of the differential amplifier and applying the stored voltage to the positive input terminal of the differential amplifier; a third switch turned on in the reset period, and coupled between the first node and the ground voltage; a second resistor coupled between the other terminal of the second switch and a second node; a third resistor having one terminal coupled to the second node; a second PNP transistor having an emitter terminal coupled to the other terminal of the third resistor and base and collector terminals coupled to the ground voltage; a second capacitor coupled between the negative input terminal of the differential amplifier and the second node, and suitable for storing the differential amplifier offset-containing initial voltage applied to the negative input terminal of the differential amplifier and applying the stored voltage to the negative input terminal of the differential amplifier; and a fourth switch turned on in the reset period, and coupled between the second node and the ground voltage.

In one aspect, a reference voltage generator is provided to comprise a differential amplifier including a positive input terminal, a negative input terminal, and an output terminal, the differential amplifier structured to amplify a difference between a first initial voltage applied to the positive input terminal and a second initial voltage applied to the negative input terminal; a first switch turned on in a reset period to couple the output terminal of the differential amplifier to the negative input terminal of the differential amplifier; a second switch turned on in a reference voltage generation period, and having one terminal coupled to the output terminal of the differential amplifier; a first capacitor coupled between the positive input terminal of the differential amplifier and a first node, and structured to store the first initial voltage during the reset period and applying the stored first initial voltage to the positive input terminal of the differential amplifier during the reference voltage generation period; and a second capacitor coupled between the negative input terminal of the differential amplifier and a second node, and structured to store the first initial voltage during the reset period and applying the stored second initial voltage to the negative input terminal of the differential amplifier during the reference voltage generation period.

The reference voltage generator may further comprise an input circuit coupled to the positive input terminal to apply a supply voltage to the positive input terminal of the differential amplifier; and an output circuit coupled to the output terminal to stabilize a reference voltage outputted from the differential amplifier through the second switch and output the stabilized reference voltage. The reference voltage generator may further comprise a first feedback loop from the output terminal of the differential amplifier to the negative input terminal of the differential amplifier by turning on the first switch in the reset period. The reference voltage generator may further comprise a second feedback loop from the output terminal of the differential amplifier to the negative input terminal of the differential amplifier by turning on the second switch in the reference voltage generation period, wherein the second negative feedback loop is formed through the second resistor and the second capacitor.

DETAILED DESCRIPTION

In the following descriptions, detailed descriptions related to well-known functions or configurations will be ruled out in order not to unnecessarily obscure subject matters of the present disclosure. Hereafter, various embodiments will be described below in more detail with reference to the accompanying drawings such that the technical idea of the present disclosure may easily be carried out by a person with ordinary skill in the art to which the present disclosure pertains.

Throughout the specification, when one element is referred to as being "connected to" or "coupled to" another element, it may indicate that the former element is directly connected or coupled to the latter element or another element is interposed therebetween. Furthermore, when an element "includes" or "has" a component, it may indicate that the element does not exclude another component unless referred to the contrary, but can further include another component. In addition, the terms of a singular form may include plural forms unless referred to the contrary.

Figure 1:
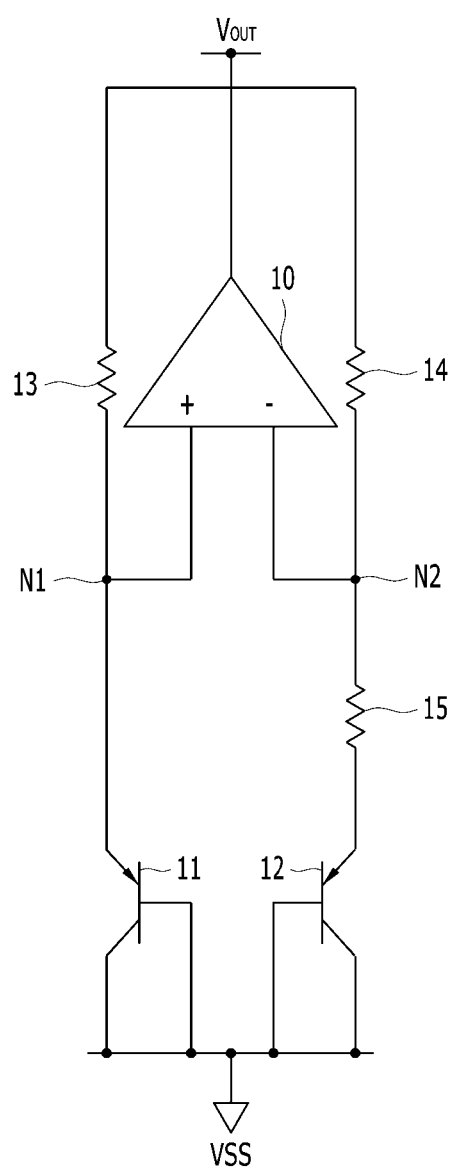
FIG. 1 is a circuit diagram of a reference voltage generator for promoting understanding of an embodiment.

FIG. 1 is a circuit diagram illustrating an example of a reference voltage generator for promoting understandings of an embodiment. The reference voltage generator is an electronic circuit or circuit element designed to produce a constant voltage output that is a standard to measure against. The voltage output produced by the reference voltage generator is used for a comparison with another signal level. The reference voltage generator is widely used in power supplies, analog-to-digital converters, digital-to-analog converts, and other various applications.

As illustrated in FIG. 1, the reference voltage generator for promoting understandings of an embodiment may include a differential amplifier 10, a first PNP transistor 11 and a second PNP transistor 12. The differential amplifier 10 has a positive input terminal(+) and a negative input terminal(−) that are connected to a first node N1 and a second node N2, respectively. The differential amplifier 10 may amplify a difference between the voltage at the first node N1 applied to the positive input terminal(+) and the voltage at the second node N2 applied to the negative input terminal (−). Each of the first PNP transistor 11 and the second PNP transistor 12 may have three terminals including an emitter terminal, a collector terminal and a base terminal. The emitter terminal of the first PNP transistor 11 may be coupled to the first node N1 and the base terminal and the collector terminal of the first PNP transistor 11 may be coupled to a ground voltage VSS. The emitter terminal of the second PNP transistor 12 may be coupled to the second node N2 and the base terminal and the collector terminal of the second PNP transistor 12 may be coupled to the ground voltage VSS. In some implementations, the ratio of the number of first PNP transistors 11 to the number of second PNP transistors 12 may be set to 1:N, where N is a natural number.

The reference voltage generator for promoting understandings of an embodiment may further include a resistor 13 coupled between a reference voltage output node (comparator output terminal) $V_{OUT}$ and the first node N1, a resistor 14 coupled between the reference voltage output node $V_{OUT}$ and the second node N2, and a resistor 15 coupled between the second node N2 and the emitter terminal of the second PNP transistor 12. The resistor 13 and the resistor 14 function to determine the currents flowing through the first node N1 and the second node N2.

The operation of the conventional reference voltage generator having the above-described structure will be briefly described as follows.

The differential amplifier 10 may amplify a difference between the voltage of the first node N1 applied to the positive input terminal(+) thereof, and the voltage of the second node N2 applied to the negative input terminal(−) thereof, and output the amplified voltage value as a reference voltage $V_{REF}$ at the reference voltage output node $V_{OUT}$.

The currents flowing through the first and second nodes N1 and N2 are emitter currents of the first and second PNP transistors 11 and 12. The bases and collectors of the first and second PNP transistors 11 and 12 are connected to the ground terminal, thereby stabilizing the voltage values at the first and second nodes N1 and N2. Even with the first and second PNP transistors 11 and 12, however, there are other limitations to improve the performance of the differential amplifier 10. For example, process variations, which may occur from various elements of the reference voltage generator during a fabrication of the reference voltage generator, have been observed to provide negative effects on the operation of the differential amplifier. Thus, in order to further improve an accuracy of the operation of the reference voltage generator, there is a need to reduce or avoid the process variations. It is noted that a process variation caused by the resistors or others may not have a significant influence on the reference voltage output, but a process variation caused by the differential amplifier may have a significant influence on the reference voltage output. While some methods for reducing the process variations caused by the differential amplifier already have been discussed in the art, those conventional methods used for reducing process variations can reduce process variations to some extent, but significantly increase the complexity of the circuit, thereby causing a problem such as an area increase.

In the recognition of this, the disclosed technology provides a new circuit or devices to reduce and minimize the process variation caused by the differential amplifier. Therefore, various implementations of the disclosed technology provide a reference voltage generator capable of improving the precision of a reference voltage, in order to minimize the influence of process variations. The reference voltage generator will be described in detail with reference to FIGS. 2A and 2B.

Figure 2A:
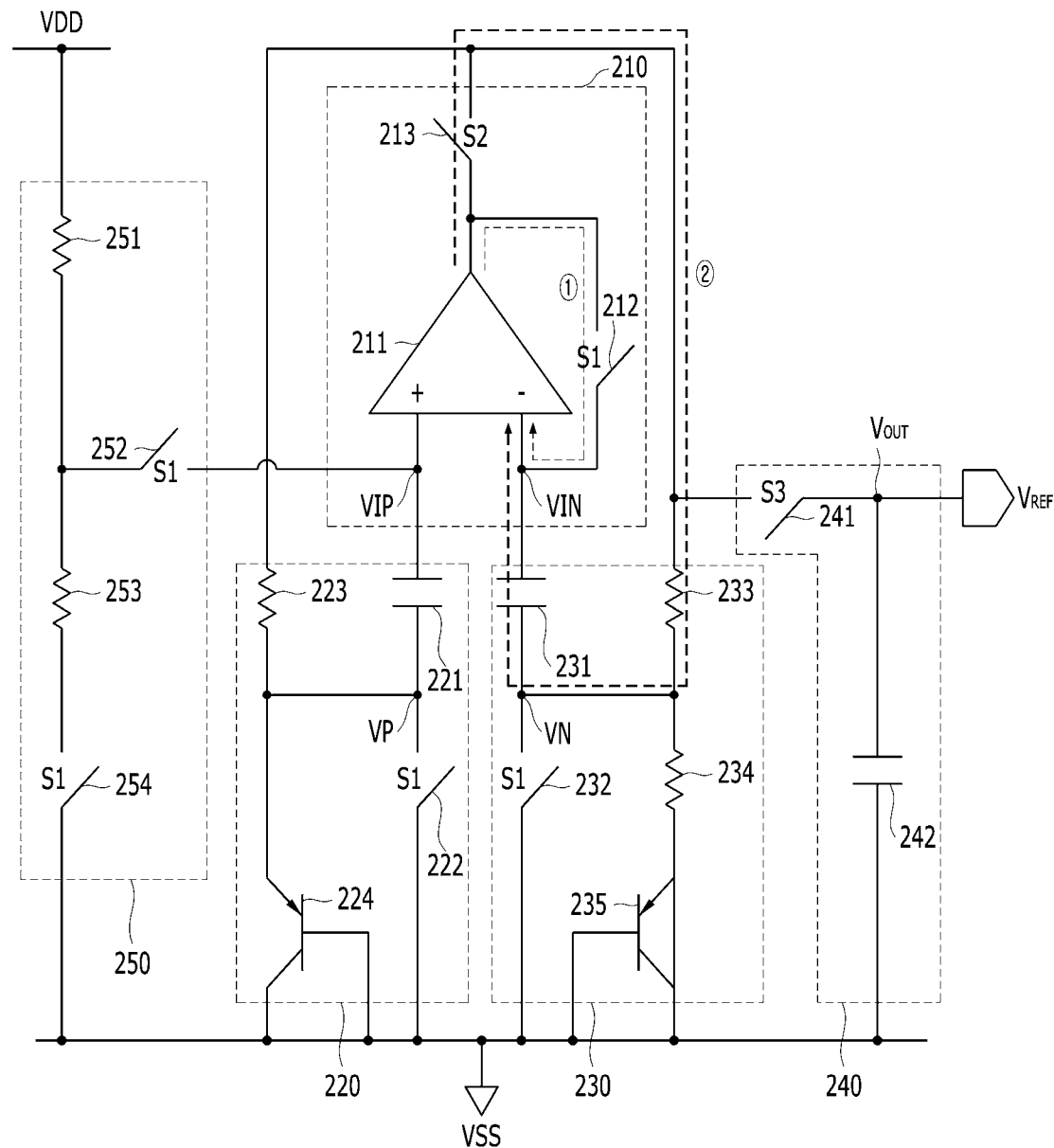
FIG. 2A is a circuit diagram of an example of a reference voltage generator in accordance with an embodiment.
Figure 2B:
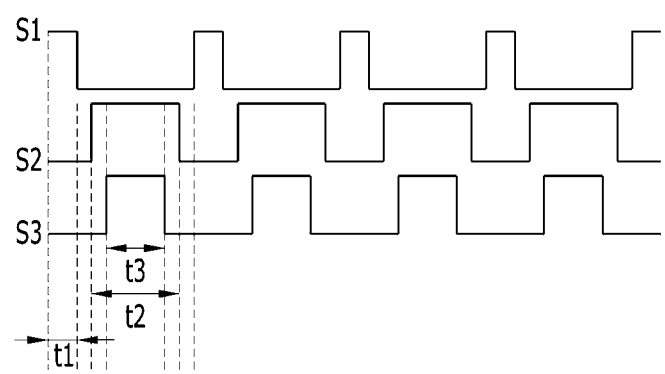
FIG. 2B is a timing diagram of the reference voltage generator illustrated in FIG. 2A.

FIG. 2A is an example of a circuit diagram of the reference voltage generator based on one implementation of the disclosed technology, and FIG. 2B is a timing diagram of the reference voltage generator illustrated in FIG. 2A.

As illustrated in FIG. 2A, the reference voltage generator in accordance with a present embodiment may include a differential amplification circuit 210, a first voltage storage circuit 220 and a second voltage storage circuit 230. The reference voltage generator in accordance with the present embodiment may further include an input circuit 250 coupled to the differential amplification circuit 210. The differential amplification circuit 210 has a positive input terminal VIP and a negative input terminal VIN. The positive input terminal VIP of the differential amplification circuit 210 may be coupled to the input circuit 250 during a reset period to perform a reset operation when the S1 switches 252 and 254 in the input circuit 250 are turned on. In addition, the differential amplification circuit 210 may operate during a reference voltage generation period to remove a differential amplifier offset $V_{OFFSET}$ of the differential amplification circuit 210 by amplifying differences between voltages applied to the positive input terminal VIP and the negative input terminal VIN. The details operations during the reset period and the reference voltage generation period are further discussed later with regard to FIG. 2B.

When a S1 switch 222 in the first voltage storage circuit 220 is turned on, the first voltage storage circuit 220 may store the voltage applied to the positive input terminal VIP according to the reset operation of the differential amplification circuit 210. When the S1 switch 222 in the first voltage storage circuit 220 is turned off, the first voltage storage circuit 220 may provide the stored voltage to the positive input terminal VIP of the differential amplification circuit 210. When a S1 switch 232 is turned on, the second voltage storage circuit 230 may store the voltage applied to the negative input terminal VIN according to the reset operation of the differential amplification circuit 210 and when the S1 switch 232 is turned off, the second voltage storage circuit 230 provide the stored voltage to the negative input terminal VIN of the differential amplification circuit 210.

The reference voltage generator in accordance with the present embodiment may further include an output circuit 240 for stabilizing a voltage $V_{OUT}$ outputted from the differential amplification circuit 210 and outputting the stabilized voltage as the reference voltage VREF. The output circuit 240 may be coupled to the output terminal of the differential amplification circuit 210 when S2 and S3 switches 213 and 241 are turned on.

The reference voltage generator in accordance with the present embodiment may further include the input circuit 250 for stably applying an initial voltage according to the supply voltage VDD to the differential amplification circuit 210. The input circuit 250 generates the initial voltage according to the supply voltage VDD that may become "VDD*(R251/(R251+R253))". The input circuit 250 may be coupled to the positive input terminal VIP of the differential amplification circuit 210 when the S1 switches 252 and 254 are turned on.

Next, referring to FIGS. 2A and 2B, the configurations and operations of the respective components will be described in more detail as follows.

FIG. 2B illustrates three timing diagrams for controlling S1 switches 252, 254, 222, 232 and 212, the S2 switch 213, and the S3 switch 241. The S1 switches 252, 254, 222, 232 and 212 are turned on during a reset period t1, the S2 switch 213 is turned on during a reference voltage generation period t2, and the S3 switch 241 is turned on during a reference voltage stabilization period t3. First, the differential amplification circuit 210 may perform a reset operation during the reset period t1 when the S1 switches 252, 254, 222, 232 and 212 are turned on and the S2 switch 213 and S3 switches 213 and 241 are turned off. Referring back to FIG. 2A, the S1 switches 252, 254, 222, 232 and 212 are included in the differential amplification circuit 210, the first voltage storage circuit 220, the second voltage storage circuit 230, and the input circuit 250. During the reset period t1, the S1 switches 252 and 254 in the input circuit 250 are turned on to couple the input circuit 250 to the positive input terminal VIP. Thus, the initial voltage "VDD*(R251/(R251+R253))" according to the supply voltage VDD from the input circuit 250 is applied to the positive input terminal VIP. The differential amplifier 211 amplifies the difference between the voltage applied to the positive input terminal VIP and the voltage applied to the negative input terminal VIN. Due to process variations and/or mismatches in the circuits, a differential amplifier offset $V_{OFFSET}$ of the differential amplifier 211 is also applied to the positive input terminal VIP. Thus, the voltage applied to the positive input terminal may become the sum of the initial voltage from the input circuit 250 and the differential amplifier offset $V_{OFFSET}$ of the differential amplifier 211, which is referred as "first initial voltage(VIP+$V_{OFFSET}$)."

During the reset period t1, since the S1 switch 212 in the differential amplification circuit 210 is turned on to couple the negative input terminal VIN to the output terminal of the differential amplifier 211, the output voltage from the differential amplifier 211 is fed back to the negative input terminal VIN to form a first negative feedback loop ①. The first negative feedback loop ① is from the output terminal of the differential amplifier to the negative input terminal VIN of the differential amplifier 211 by turning on the S1 switch 212 during the reset period T1. Due to process variations and/or mismatches in the circuits, the differential amplifier offset $V_{OFFSET}$ of the differential amplifier 211 is also applied to the negative input terminal VIN which is referred to as "second initial voltage(VIN+$V_{OFFSET}$)." The voltage applied to the negative input terminal VIN may be not exactly same as the voltage applied to the positive input terminal VIP.

During the reset period t1, the S1 switch 222 included in the first voltage storage circuit 220 may be turned on to couple a first node VP to the ground VSS and the S1 switch 232 included in the second voltage storage circuit 230 may be turned on to couple a second node VN to the ground VSS. Thus, "the first initial voltage(VIP+$V_{OFFSET}$)" applied to the positive input terminal VIP is stored in the first voltage storage circuit 220, and "the second initial voltage(VIN+$V_{OFFSET}$)" applied to the negative input terminal VIN is stored in the second voltage storage circuit 230. Then, during the reference voltage generation period t2 when the S1 switches 252, 254, 222, 232 and 212 are turned off and the S2 switch 213 is turned on, the differential amplification circuit 210 may remove or reduce the differential amplifier offset $V_{OFFSET}$ by amplifying the differences (VIP+$V_{OFFSET}$-(VIN+$V_{OFFSET}$)) between the first initial voltage applied to the positive input terminal VIP f and the second initial voltage applied to the negative input terminal VIN.

The differential amplification circuit 210 may include a differential amplifier 211, the S1 switch 212 and the S2 switch 213. The differential amplifier 211 may amplify the difference between the first initial voltage applied to the positive input terminal VIP and the second initial voltage applied to the negative input terminal VIN. The S1 switch 212 may be turned on in the reset period t1 to couple the output terminal of the differential amplifier 211 to the negative input terminal VIN of the differential amplifier 211. The S2 switch 213 may be turned on in the reference voltage generation period t2 to couple the output terminal of the differential amplifier 211 to the first and second voltage storage circuits 220 and 230.

During the reset period t1, the first voltage storage circuit 220 may store the first initial voltage(VIP+$V_{OFFSET}$) which is generated according to the reset operation of the differential amplification circuit 210. During the reference voltage generation period t2, the first initial voltage(VIP+$V_{OFFSET}$) stored in the first voltage storage circuit 220 during the reset period t1 is applied to the positive input terminal VIP of the differential amplification circuit 210.

The first voltage storage circuit 220 may include a capacitor 221 and an S1 switch 222. The capacitor 221 may be coupled between the positive input terminal VIP of the differential amplification circuit 210 and the first node VP, store the first initial voltage(VIP+$V_{OFFSET}$) applied to the positive input terminal VIP of the differential amplification circuit 210, and apply the stored first initial voltage(VIP+$V_{OFFSET}$) to the positive input terminal VIP of the differential amplification circuit 210. The S1 switch 222 may be turned on in the reset period t1 to couple the first node VP to the ground voltage VSS. The first voltage storage circuit 220 may further include a resistor 223 and a first PNP transistor 224. The resistor 223 may be coupled between the output terminal of the differential amplification circuit 210 and the first node VP, and the first PNP transistor 224 may have an emitter terminal coupled to the first node VP and base and collector terminals coupled to the ground voltage VSS. The first PNP transistor 224 may be implemented with a PMOS transistor having a source terminal coupled to the first node VP and gate and drain terminals coupled to the ground voltage VSS.

During the reset period t1, the second voltage storage circuit 230 may store "the second initial voltage(VIN+$V_{OFFSET}$) which is generated according to the reset operation of the differential amplification circuit 210. During the reference voltage generation period t2, the second initial voltage(VIN+$V_{OFFSET}$) stored in the second voltage storage circuit 230 during the reset period t1 is applied to the negative input terminal VIN of the differential amplification circuit 210.

The second voltage storage circuit 230 may include a capacitor 231 and an S1 switch 232. The capacitor 221 may be coupled between the negative input terminal VIN of the differential amplification circuit 210 and the second node VN, store the second initial voltage(VIP+$V_{OFFSET}$) applied to the negative input terminal VIN of the differential amplification circuit 210, and apply the stored second initial voltage (VIP+$V_{OFFSET}$) to the negative input terminal VIN of the differential amplification circuit 210. The S1 switch 232 may be turned on in the reset period t1 to couple the second node VN to the ground voltage VSS. The second voltage storage circuit 230 may further include a resistor 233, a resistor 234 and a second PNP transistor 235. The resistor 233 may be coupled between the output terminal of the differential amplification circuit 210 and the second node VN, the resistor 234 may be coupled between the second node VN and an emitter terminal of the second PNP transistor 235, and the second PNP transistor 235 may have the emitter terminal coupled to the resistor 234 and base and collector terminals coupled to the ground voltage VSS. The second PNP transistor 235 may be implemented with a PMOS transistor having a source terminal coupled to the resistor 234 and gate and drain terminals coupled to the ground voltage VSS. During the reference voltage generation period t2, since the S2 switch 213 in the differential amplification circuit 210 is turned on to couple the negative input terminal VIN to the output terminal of the differential amplifier 211. The output voltage from the differential amplifier 211 is fed back to the negative input terminal VIN to form a second negative feedback loop ②. The second negative feedback loop ② is from the output terminal of the differential amplifier 211 to the negative input terminal VIN of the differential amplifier 211 through the resistor 233 and the capacitor 231.

During the reference voltage stabilization period t3, the switch S3 included in the output circuit 240 is turned on to couple the output terminal of the differential amplifier 211 to the output circuit 240. As shown in FIG. 2B, the S3 switch 241 is turned on while the S2 switch 213 is turned on. The reference voltage stabilization period t3 may be shorter than the reference voltage generation period t2. The output circuit 240 may stabilize the reference voltage outputted from the differential amplification circuit 210 and output the stabilized voltage in the reference voltage stabilization period t3.

The output circuit 240 may include the S3 switch 241 and a capacitor 242. The S3 switch 241 may be turned on in the reference voltage stabilization period t3 to couple the output terminal of the differential amplification circuit 210 to the output node $V_{OUT}$, and the capacitor 242 may be coupled between the output node $V_{OUT}$ and the ground voltage VSS.

The input circuit 250 may stably apply the supply voltage VDD to the positive input terminal VIP of the differential amplification circuit 210 such that the reset operation is performed based on the supply voltage VDD.

The input circuit 250 may include a resistor 251, an S1 switch 252, a resistor 253 and an S1 switch 254. The resistor 251 may have one terminal coupled to the supply voltage VDD, the S1 switch 252 may be turned on in the reset period t1 to couple the other terminal of the resistor 251 to the positive input terminal VIP of the differential amplification circuit 210, the resistor 253 may have one terminal coupled to the other terminal of the resistor 251, and the S1 switch 254 may be turned on in the reset period t1 to couple the other terminal of the resistor 253 to the ground voltage VSS.

During the reset period t1, all of the S1 switches 252, 254, 222, 232 and 212 may be turned on, and the S2 switch 213 and the S3 switch 241 may be turned off. Thus, the initial voltage according to the supply voltage VDD from the input circuit 250, more specifically, the portion of the supply voltage VDD may be applied to the positive input terminal VIP of the differential amplifier 211, and the differential amplifier 211 may perform the reset operation. As discussed, the first initial voltage and the second initial voltage may be stored in the capacitors of the first and second voltage storage circuits 220 and 230, respectively. During the reset period t1, the first and second nodes VP and VN may be coupled to the ground voltage VSS of 0V, for example.

During the reference voltage generation period t2, all of the S1 switches 252, 254, 222, 232 and 212 may be turned off, and the S2 switch 213 may be turned on. Thus, the respective components in the first voltage storage circuit 220 and the second voltage storage circuit 230 may be operated in such a manner that the capacitors 221 and 231 allow the first and second nodes VP and VN to maintain their voltages, i.e., the first initial voltage(VIP+$V_{OFFSET}$) and the second initial voltage(VIN+$V_{OFFSET}$), as stored in the first and second voltage storage circuits 220 and 230. During the reference voltage generation period t2, the first initial voltage and the second initial voltage stored in the first and second voltage storage circuits 220 and 230 are provided to the positive input terminal VIP and the negative input terminal VIN of the differential amplifier.

During the reference voltage stabilization period t3, the S3 switch 241 may be turned on while all of the S1 switches 252, 254, 222, 232 and 212 are turned off and the S2 switch 213 is turned on. The reference voltage VREF can be stabilized as discussed below.

Since the capacitors of the first and second voltage storage circuits 220 and 230 usually have a leakage current, the capacitors may not continuously maintain the desired voltages supplied to the positive input terminal VIP and the negative input terminal VIN, which affects to the reference voltage VREF. Thus, the reference voltage VREF cannot be maintained during a whole operation of the reference voltage generator. Therefore, an external controller (not illustrated), for example, a timing generator, may be provided to periodically control the turning on or off of the switches as illustrated in FIG. 2B. The external controller allows to retain the reference voltage without being affected by the leakage current and others. Thus, the reference voltage generator may be periodically operated to retain the reference voltage.

Figure 3A:
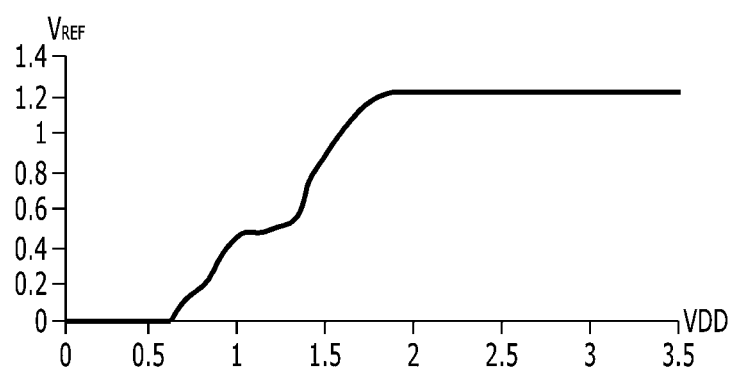
FIG. 3A illustrates an example of a reference voltage output characteristic of the reference voltage generator of FIG. 2A depending on a supply voltage.

FIG. 3A illustrates a reference voltage output characteristic of the reference voltage generator of FIG. 2A depending on the supply voltage VDD. FIG. 3A shows that, when a supply voltage VDD of about 2V is applied, a reference voltage of about 1.2V is stably generated.

Figure 3B:
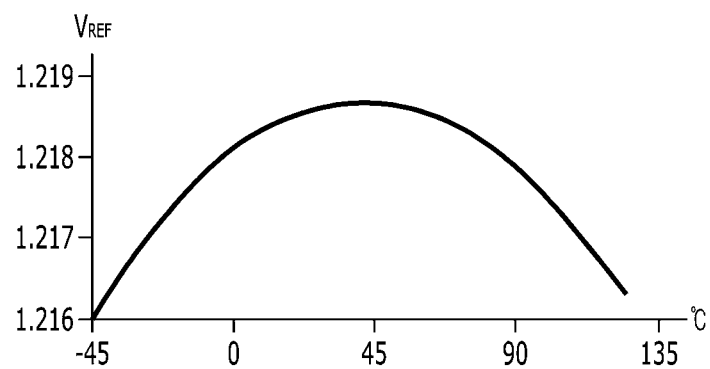
FIG. 3B illustrates an example of a reference voltage output characteristic of the reference voltage generator of FIG. 2A depending on temperature.

FIG. 3B illustrates a reference voltage output characteristic of the reference voltage generator of FIG. 2A depending on temperature. FIG. 3B shows that the reference voltage generator has the greatest reference voltage output at a temperature of about 45° C.

Figure 4A:
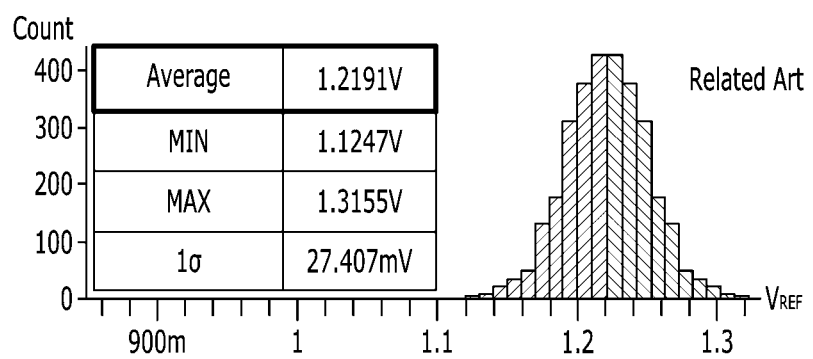
FIG. 4A illustrates a simulation result of the conventional reference voltage generator.

FIG. 4A illustrates a simulation result of the conventional reference voltage generator, showing that a standard deviation (σ) is approximately 27.407 mV. The "Count" on a vertical axis represents the number of simulations and The "VREF" on a horizontal axis represents a reference voltage according to the simulation result.

Figure 4B:
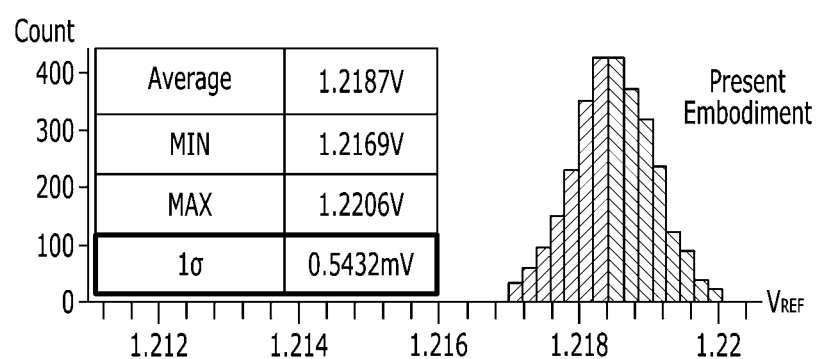
FIG. 4B illustrates a simulation result of an example of a reference voltage generator in accordance with one implementation of the disclosed technology.

FIG. 4B illustrates a simulation result of the reference voltage generator in accordance with the present embodiment, showing that a standard deviation (σ) is approximately 0.55432 mV, which indicates that the simulation result is far superior to the simulation result of the conventional reference generator in FIG. 4A. That is, since the standard deviation (σ) of the reference voltages VREF of the present invention is smaller than the standard deviation (σ) of the conventional reference voltages, a performance of the reference voltage generator in accordance with the present embodiment is remarkably excellent.

The above-described reference voltage generator in accordance with the present embodiment may be applied to various electronic devices such as a CMOS image sensor (CIS) having an array of CMOS optical sensing elements that produces charges in response to incident light, which require a reference voltage.

In accordance with the present embodiments, the reference voltage generator can minimize an influence of process variation, thereby improving the precision of the reference voltage.

Furthermore, the reference voltage generator can reduce the complexity of the circuit in comparison to the conventional methods, thereby reducing the area.

Although various embodiments have been described for illustrative purposes, it will be apparent to those skilled in the art that various changes and modifications may be made without departing from the spirit and scope of the invention as defined in the following claims.

What is claimed is:

1. A reference voltage generator comprising:
   a differential amplification circuit including a positive input terminal coupled to a supply voltage to receive a voltage from the supply voltage and a negative input terminal coupled to an output terminal of the differential amplification circuit, the differential amplification circuit structured to perform a reset operation based on the received voltage from the supply voltage during a reset period and amplify a difference between a first initial voltage applied to the positive input terminal and a second initial voltage applied to the negative input terminal during a reference voltage generation period; and
   first and second voltage storage circuits coupled to the positive input terminal and the negative input terminal, respectively, and structured to store the first initial voltage and the second initial voltage, respectively, and
   wherein the first voltage storage circuit comprises:
   a first capacitor coupled between the positive input terminal of the differential amplification circuit and a first node located between the positive input terminal and a ground voltage;
   a switch turned on in the reset period to couple the first node to the ground voltage;
   a resistor coupled between the output terminal of the differential amplification circuit and the first node; and
   a first transistor having a first terminal coupled to the first node and second and third terminals that are coupled to the ground voltage.

2. The reference voltage generator of claim 1, further comprising an output circuit coupled to the differential amplification circuit and structured to stabilize an output voltage outputted from the differential amplification circuit.

3. The reference voltage generator of claim 2, wherein the output circuit comprises:
   a switch turned on in a reference voltage stabilization period to couple the output terminal of the differential amplification circuit and an output node of the output circuit; and
   a capacitor coupled between the output node and a ground voltage.

4. The reference voltage generator of claim 1, further comprising an input circuit coupled to the supply voltage and coupled to the positive input terminal of the differential amplification circuit during the reset period to applying the voltage from the supply voltage to the differential amplification circuit.

5. The reference voltage generator of claim 4, wherein the input circuit comprises:
   a first resistor having a first terminal coupled to the supply voltage;
   a first switch turned on in the reset period, and coupled between a second terminal of the first resistor and the positive input terminal of the differential amplification circuit;
   a second resistor having a third terminal coupled to the second terminal of the first resistor; and
   a second switch coupled between a fourth terminal of the second resistor and a ground voltage.

6. The reference voltage generator of claim 1, wherein, during the reset period:
   the first voltage storage circuit stores the first initial voltage according to the reset operation of the differential amplification circuit, and provides the stored first initial voltage to the positive input terminal of the differential amplification circuit, and
   the second voltage storage circuit stores the second initial voltage according to the reset operation of the differential amplification circuit and provides the stored second initial voltage to the negative input terminal of the differential amplification circuit.

7. The reference voltage generator of claim 1, wherein, during the reference voltage generation period, the differential amplification circuit further outputs an output voltage applied to the output terminal of the differential amplification circuit as a reference voltage.

8. The reference voltage generator of claim 1, wherein the differential amplification circuit comprises:
   a differential amplifier amplifying differences between the first initial voltage applied to the positive input terminal and the second initial voltage applied to the negative input terminal;
   a first switch turned on during the reset period to couple the output terminal of the differential amplification circuit to the negative input terminal of the differential amplification circuit; and
   a second switch turned on during the reference voltage generation period to couple the output terminal of the differential amplification circuit to the first and second voltage storage circuits.

9. The reference voltage generator of claim 1, wherein the first voltage storage circuit stores the first initial voltage in the reset period and provides the stored first initial voltage to the positive input terminal of the differential amplification circuit in the reference voltage generation period.

10. The reference voltage generator of claim 1, wherein the first transistor includes a PNP transistor,
    wherein the first terminal of the PNP transistor is an emitter terminal,
    wherein the second and third terminals of the PNP transistor are base and collector terminal, respectively.

11. The reference voltage generator of claim 1, wherein the first transistor includes a PMOS transistor
    wherein the first terminal of the PMOS transistor is a source terminal,
    wherein the second and third terminals of the PMOS transistor are gate and drain terminal, respectively.

12. The reference voltage generator of claim 1, wherein the second voltage storage circuit stores the second initial voltage in the reset period and provides the stored second initial voltage to the negative input terminal of the differential amplification circuit in the reference voltage generation period.

13. The reference voltage generator of claim 1, wherein the second voltage storage circuit comprises:
    A second capacitor coupled between the negative input terminal of the differential amplification circuit and a second node located between the negative input terminal and a ground voltage; and a switch turned on in the reset period to couple the second node to the ground voltage.

14. A reference voltage generator comprising:

a differential amplification circuit including a positive input terminal coupled to a supply voltage to receive a voltage from the supply voltage and a negative input terminal coupled to an output terminal of the differential amplification circuit, the differential amplification circuit structured to perform a reset operation based on the received voltage from the supply voltage during a reset period and amplify a difference between a first initial voltage applied to the positive input terminal and a second initial voltage applied to the negative input terminal during a reference voltage generation period; and first and second voltage storage circuits coupled to the positive input terminal and the negative input terminal, respectively, and structured to store the first initial voltage and the second initial voltage, respectively, wherein the second voltage storage circuit comprises:

a capacitor coupled between the negative input terminal of the differential amplification circuit and a second node located between the negative input terminal and a ground voltage; and a switch turned on in the reset period to couple the second node to the ground voltage, and wherein the second voltage storage circuit comprises:

a first resistor coupled between the output terminal of the differential amplification circuit and the second node;

a second resistor coupled between the second node and an first terminal of the first transistor; and the first transistor having the first terminal coupled to the second resistor and second and third terminals that are coupled to the ground voltage.

15. The reference voltage generator of claim 1, wherein the first initial voltage and the second initial voltage include a differential amplifier offset caused by process mismatch.

16. The reference voltage generator of claim 1, wherein the reset period and the reference voltage generation period repeat periodically.

17. The reference voltage generator of claim 14, wherein the first transistor includes a PNP transistor, wherein the first terminal of the PNP transistor is an emitter terminal, wherein the second and third terminals of the PNP transistor are base and collector terminal, respectively.

18. The reference voltage generator of claim 14, wherein the first transistor includes a PMOS transistor wherein the first terminal of the PMOS transistor is a source terminal, wherein the second and third terminals of the PMOS transistor are gate and drain terminal, respectively.

19. A reference voltage generator comprising:

a differential amplifier structured to differentially amplify a difference between a voltage applied to a positive input terminal thereof and a voltage applied to a negative input terminal thereof;

a first switch turned on in a reset period, and coupled between an output terminal of the differential amplifier and the negative input terminal of the differential amplifier;

a second switch turned on in a reference voltage generation period, and having one terminal coupled to the output terminal of the differential amplifier;

a first resistor coupled between the other terminal of the second switch and a first node;

a first PNP transistor having an emitter terminal coupled to the first node and base and collector terminals coupled to a ground voltage;

a first capacitor coupled between the positive input terminal of the differential amplifier and the first node, and suitable for storing a differential amplifier offset-containing initial voltage applied to the positive input terminal of the differential amplifier and applying the stored voltage to the positive input terminal of the differential amplifier;

a third switch turned on in the reset period, and coupled between the first node and the ground voltage;

a second resistor coupled between the other terminal of the second switch and a second node;

a third resistor having one terminal coupled to the second node;

a second PNP transistor having an emitter terminal coupled to the other terminal of the third resistor and base and collector terminals coupled to the ground voltage;

a second capacitor coupled between the negative input terminal of the differential amplifier and the second node, and suitable for storing the differential amplifier offset-containing initial voltage applied to the negative input terminal of the differential amplifier and applying the stored voltage to the negative input terminal of the differential amplifier; and a fourth switch turned on in the reset period and coupled between the second node and the ground voltage.

20. The reference voltage generator of claim 19, further comprising:

an input circuit coupled to the positive input terminal to apply a supply voltage to the positive input terminal of the differential amplifier; and an output circuit coupled to the output terminal to stabilize a reference voltage outputted from the differential amplifier through the second switch and output the stabilized reference voltage.

21. The reference voltage generator of claim 19, further comprising: a first feedback loop from the output terminal of the differential amplifier to the negative input terminal of the differential amplifier by turning on the first switch in the reset period.

22. The reference voltage generator of claim 19, further comprising:

a second feedback loop from the output terminal of the differential amplifier to the negative input terminal of the differential amplifier by turning on the second switch in the reference voltage generation period, wherein the second negative feedback loop is formed through the second resistor and the second capacitor.

* * * * *